United States Patent [19]
Saito

[11] Patent Number: 5,390,148
[45] Date of Patent: Feb. 14, 1995

[54] METHOD OF REWRITING DATA IN EEPROM, AND EEPROM CARD

[75] Inventor: Osamu Saito, Tokyo, Japan

[73] Assignee: Fuji Photo Film Co., Ltd., Kanagawa, Japan

[21] Appl. No.: 20,541

[22] Filed: Feb. 22, 1993

[30] Foreign Application Priority Data

Feb. 25, 1992 [JP] Japan ................................. 4-073255

[51] Int. Cl.⁶ ...................... G11C 16/00; G06F 12/16
[52] U.S. Cl. .......................... 365/189.01; 365/189.07; 365/900; 365/218
[58] Field of Search ................ 365/189.07, 218, 222, 365/189.01, 900, 230.01; 235/380, 382, 385

[56] References Cited

U.S. PATENT DOCUMENTS

| | | | |
|---|---|---|---|
| 4,402,065 | 8/1983 | Taylor . | |
| 4,584,663 | 4/1986 | Tanikawa | 364/900 |
| 4,716,552 | 12/1987 | Maltiel et al. | 365/222 |
| 4,800,520 | 1/1989 | Iijima | 235/382 |
| 4,811,294 | 3/1989 | Kobayashi et al. | 365/218 |
| 4,887,234 | 12/1989 | Iijima | 235/380 |
| 4,888,686 | 12/1989 | Sinz et al. | 365/189.07 |
| 5,197,026 | 3/1993 | Butler | 365/189.07 |

FOREIGN PATENT DOCUMENTS 0528280 2/1993 European Pat. Off. .

OTHER PUBLICATIONS

Patent Abstracts of Japan, vol. 8, No. 179 (P-295) (1616) 17 Aug. 1984 JP-A-59-071180, 21 Apr. 1984.

*Primary Examiner*—Viet Q. Nguyen
*Attorney, Agent, or Firm*—Sughrue, Mion, Zinn, Macpeak & Seas

[57] ABSTRACT

A memory card includes an S-RAM in addition to an EEPROM. When old data constituting part of data that has been recorded in the EEPROM is to be rewritten, the old data to be rewritten is read out of the EEPROM and applied to the S-RAM, where the old data is temporarily stored. The old data in the S-RAM is rewritten to new data, and the new data is applied to and written in the EEPROM. A comparator circuit determines whether all bits of the new data rewritten in the S-RAM and all bits of the new data written in the EEPROM coincide. If all bits coincide, this is verification that the changed data has been stored in the EEPROM correctly. Thus, the reliability with which data is rewritten in the EEPROM is improved.

20 Claims, 8 Drawing Sheets

Fig. 4a

| LAST-WRITTEN PHYSICAL CLUSTER ADDRESS | LOGICAL CLUSTER ADDRESS | |
|---|---|---|
| 0 | ad1 | 0 |
|  | ad2 | 0 |
|  | ad3 | 0 |
|  | ad4 | 0 |
|  | ad5 | 0 |
|  | ad6 | 0 |
|  | ad7 | 0 |
|  | ad8 | 0 |
|  | | LOGICAL CLUSTER AREA |

Fig. 4b

| OVER-WRITTEN LOGICAL CLUSTER ADDRESS | PHYSICAL CLUSTER ADDRESS | |
|---|---|---|
| 0 | AD1 | BLANK STATE |
|  | AD2 | BLANK STATE |
|  | AD3 | BLANK STATE |
|  | AD4 | BLANK STATE |
|  | AD5 | BLANK STATE |
|  | AD6 | BLANK STATE |
|  | AD7 | BLANK STATE |
|  | AD8 | BLANK STATE |
|  | AD9 | BLANK STATE |
|  | AD10 | BLANK STATE |
|  | AD11 | BLANK STATE |
|  | AD12 | BLANK STATE |
|  | | PHYSICAL CLUSTER AREA |

Fig.5a

| LAST-WRITTEN PHYSICAL CLUSTER ADDRESS | LOGICAL CLUSTER ADDRESS | |
|---|---|---|
| AD8 | ad1 | AD1 |
| | ad2 | AD2 |
| | ad3 | AD3 |
| | ad4 | AD4 |
| | ad5 | AD5 |
| | ad6 | AD6 |
| | ad7 | AD7 |
| | ad8 | AD8 |
| | | LOGICAL CLUSTER AREA |

OVER-WRITTEN LOGICAL CLUSTER ADDRESS: 0

Fig.5b

| PHYSICAL CLUSTER ADDRESS | |
|---|---|
| AD1 | CLUSTER DATA CLD1 ($A_1$, $B_1$, $C_1$, $D_1$) |
| AD2 | CLUSTER DATA CLD2 ($A_2$, $B_2$, $C_2$, $D_2$) |
| AD3 | CLUSTER DATA CLD3 ($A_3$, $B_3$, $C_3$, $D_3$) |
| AD4 | CLUSTER DATA CLD4 ($A_4$, $B_4$, $C_4$, $D_4$) |
| AD5 | CLUSTER DATA CLD5 ($A_5$, $B_5$, $C_5$, $D_5$) |
| AD6 | CLUSTER DATA CLD6 ($A_6$, $B_6$, $C_6$, $D_6$) |
| AD7 | CLUSTER DATA CLD7 ($A_7$, $B_7$, $C_7$, $D_7$) |
| AD8 | CLUSTER DATA CLD8 ($A_8$, $B_8$, $C_8$, $D_8$) |
| AD9 | BLANK STATE |
| AD10 | BLANK STATE |
| AD11 | BLANK STATE |
| AD12 | BLANK STATE |

PHYSICAL CLUSTER AREA

Fig. 6a

LAST-WRITTEN PHYSICAL CLUSTER ADDRESS: AD9

| LOGICAL CLUSTER ADDRESS | LOGICAL CLUSTER AREA |
|---|---|
| ad1 | AD1 |
| ad2 | AD9 |
| ad3 | AD3 |
| ad4 | AD4 |
| ad5 | AD5 |
| ad6 | AD6 |
| ad7 | AD7 |
| ad8 | AD8 |

OVER-WRITTEN LOGICAL CLUSTER ADDRESS: 0

Fig. 6b

| PHYSICAL CLUSTER ADDRESS | PHYSICAL CLUSTER AREA |
|---|---|
| AD1 | CLUSTER DATA CLD1 ($A_1$, $B_1$, $C_1$, $D_1$) |
| AD2 | DEFECTIVE AREA |
| AD3 | CLUSTER DATA CLD3 ($A_3$, $B_3$, $C_3$, $D_3$) |
| AD4 | CLUSTER DATA CLD4 ($A_4$, $B_4$, $C_4$, $D_4$) |
| AD5 | CLUSTER DATA CLD5 ($A_5$, $B_5$, $C_5$, $D_5$) |
| AD6 | CLUSTER DATA CLD6 ($A_6$, $B_6$, $C_6$, $D_6$) |
| AD7 | CLUSTER DATA CLD7 ($A_7$, $B_7$, $C_7$, $D_7$) |
| AD8 | CLUSTER DATA CLD8 ($A_8$, $B_8$, $C_8$, $D_8$) |
| AD9 | CLUSTER DATA CLD2 ($A_2$, $B_2$, $C_2$, $E_2$) |
| AD10 | BLANK STATE |
| AD11 | BLANK STATE |
| AD12 | BLANK STATE |

Fig. 7b

| PHYSICAL CLUSTER ADDRESS | PHYSICAL CLUSTER AREA |
|---|---|
| AD1 | CLUSTER DATA CLD1 ($A_1$, $B_1$, $C_1$, $D_1$) |
| AD2 | DEFECTIVE AREA |
| AD3 | BLANK STATE |
| AD4 | CLUSTER DATA CLD4 ($A_4$, $B_4$, $C_4$, $D_4$) |
| AD5 | CLUSTER DATA CLD5 ($A_5$, $B_5$, $C_5$, $D_5$) |
| AD6 | CLUSTER DATA CLD6 ($A_6$, $B_6$, $C_6$, $D_6$) |
| AD7 | CLUSTER DATA CLD7 ($A_7$, $B_7$, $C_7$, $D_7$) |
| AD8 | CLUSTER DATA CLD8 ($A_8$, $B_8$, $C_8$, $D_8$) |
| AD9 | CLUSTER DATA CLD2 ($A_2$, $B_2$, $C_2$, $E_2$) |
| AD10 | CLUSTER DATA CLD3 ($A_3$, $B_3$, $C_3$, $D_3$) |
| AD11 | BLANK STATE |
| AD12 | BLANK STATE |

OVER-WRITTEN LOGICAL CLUSTER ADDRESS: ad3

Fig. 7a

| LOGICAL CLUSTER ADDRESS | LOGICAL CLUSTER AREA |
|---|---|
| ad1 | AD1 |
| ad2 | AD9 |
| ad3 | AD10 |
| ad4 | AD4 |
| ad5 | AD5 |
| ad6 | AD6 |
| ad7 | AD7 |
| ad8 | AD8 |

LAST-WRITTEN PHYSICAL CLUSTER ADDRESS: AD10

Fig. 8b

| PHYSICAL CLUSTER ADDRESS | |
|---|---|
| AD1 | CLUSTER DATA CLD1 ($A_1$, $B_1$, $C_1$, $D_1$) |
| AD2 | DEFECTIVE AREA |
| AD3 | CLUSTER DATA CLD4 ($A_4$, $B_4$, $C_4$, $D_4$) |
| AD4 | BLANK STATE |
| AD5 | CLUSTER DATA CLD5 ($A_5$, $B_5$, $C_5$, $D_5$) |
| AD6 | CLUSTER DATA CLD6 ($A_6$, $B_6$, $C_6$, $D_6$) |
| AD7 | CLUSTER DATA CLD7 ($A_7$, $B_7$, $C_7$, $D_7$) |
| AD8 | CLUSTER DATA CLD8 ($A_8$, $B_8$, $C_8$, $D_8$) |
| AD9 | CLUSTER DATA CLD2 ($A_2$, $B_2$, $C_2$, $E_2$) |
| AD10 | CLUSTER DATA CLD3 ($A_3$, $B_3$, $C_3$, $D_3$) |
| AD11 | BLANK STATE |
| AD12 | BLANK STATE |

PHYSICAL CLUSTER AREA

OVER-WRITTEN LOGICAL CLUSTER ADDRESS: ad4

Fig. 8a

LAST-WRITTEN PHYSICAL CLUSTER ADDRESS: AD10

| LOGICAL CLUSTER ADDRESS | |
|---|---|
| ad1 | AD1 |
| ad2 | AD9 |
| ad3 | AD10 |
| ad4 | AD3 |
| ad5 | AD5 |
| ad6 | AD6 |
| ad7 | AD7 |
| ad8 | AD8 |

LOGICAL CLUSTER AREA

Fig. 9a

LAST-WRITTEN PHYSICAL CLUSTER ADDRESS: AD11

| LOGICAL CLUSTER ADDRESS | |
|---|---|
| ad1 | AD1 |
| ad2 | AD9 |
| ad3 | AD10 |
| ad4 | AD3 |
| ad5 | AD11 |
| ad6 | AD6 |
| ad7 | AD7 |
| ad8 | AD8 |

LOGICAL CLUSTER AREA

Fig. 9b

OVER-WRITTEN LOGICAL CLUSTER ADDRESS: ad5

| PHYSICAL CLUSTER ADDRESS | |
|---|---|
| AD1 | CLUSTER DATA CLD1 ($A_1$, $B_1$, $C_1$, $D_1$) |
| AD2 | DEFECTIVE AREA |
| AD3 | CLUSTER DATA CLD4 ($A_4$, $B_4$, $C_4$, $D_4$) |
| AD4 | DEFECTIVE AREA |
| AD5 | BLANK STATE |
| AD6 | CLUSTER DATA CLD6 ($A_6$, $B_6$, $C_6$, $D_6$) |
| AD7 | CLUSTER DATA CLD7 ($A_7$, $B_7$, $C_7$, $D_7$) |
| AD8 | CLUSTER DATA CLD8 ($A_8$, $B_8$, $C_8$, $D_8$) |
| AD9 | CLUSTER DATA CLD2 ($A_2$, $B_2$, $C_2$, $E_2$) |
| AD10 | CLUSTER DATA CLD3 ($A_3$, $B_3$, $C_3$, $D_3$) |
| AD11 | CLUSTER DATA CLD5 ($A_5$, $B_5$, $C_5$, $E_5$) |
| AD12 | BLANK STATE |

PHYSICAL CLUSTER AREA

METHOD OF REWRITING DATA IN EEPROM, AND EEPROM CARD

BACKGROUND OF THE INVENTION

1. Field of the Invention

This invention relates to a method of rewriting data in an EEPROM (electrically erasable programmable read-only memory), as well as to an EEPROM card.

2. Description of the Related Art

Memory cards of the type incorporating an S-RAM (static random-access memory) inside a case are disadvantageous in that battery back-up is required and the unit price per bit is high. Accordingly, the development of memory cards equipped with an EEPROM designed to eliminate these drawbacks is proceeding. Though a memory card having an internal EEPROM is advantageous in that battery back-up is unnecessary while the unit price per bit is low, the number of rewriting operations possible is on the order 10,000. In terms of reliability, therefore, a memory card of this type is inferior to the card having the internal S-RAM.

SUMMARY OF THE INVENTION

An object of the present invention is to improve the reliability with which data can be rewritten in an EEPROM.

According to the present invention, the foregoing object is attained by providing a method of rewriting an EEPROM card comprising a step of addressing an area of an EEPROM in which first data that includes old data to be rewritten has been stored and reading out the first data that has been stored in this area, a step of writing the first data, which has been read out of the EEPROM, in a RAM, a step of generating second data in the RAM by rewriting new data for the old data in the first data that has been written in the RAM, a step of addressing an area of the EEPROM in which the second data, which includes the new data, is to be written, and writing the second data, which has been read out of the RAM, in this area, and a step of reading the second data out of the RAM, reading the second data, which has been written in the EEPROM, out of the EEPROM, and determining whether the second data read out of the RAM and the second data read out of the EEPROM coincide.

Further, according to the present invention, the foregoing object is attained by providing an EEPROM card comprising an EEPROM in which data is capable of being erased and written, a RAM for performing an operation through which data in the EEPROM is updated, first data reading/writing means for addressing an area of the EEPROM in which first data that includes old data to be rewritten has been stored, reading out the first data that has been stored in this area and writing the first data, which has been read out of the EEPROM, in the RAM, data updating means for generating second data by rewriting new data for the old data in the first data that has been written in the RAM, data writing means for addressing an area of the EEPROM in which the second data, which has been rewritten by the data updating means, is to be written, and writing the second data in this area, and discriminating means for comparing the second data in the RAM, which data has been rewritten by the data updating means, and the second data that has been written in the EEPROM by the data writing means, and determining whether the rewritten second data in the RAM and the second data written in the EEPROM coincide.

In accordance with the invention, the first data containing the old data to be rewritten is read out of the EEPROM and written in the RAM. The old data in the first data that has been written in the RAM is rewritten into new data, whereby second data is produced. The second data is written in the EEPROM.

In an embodiment of the invention, an area of the EEPROM from which the first data is read out and an area of the EEPROM in which the second data is written are the same area.

In one embodiment of the invention, when it is determined that the second data in the RAM does not coincide with the second data in the EEPROM, the second data is written in another area of the EEPROM. It is again determined whether the second data in the RAM coincides with the second data that has been written in the other area of the EEPROM.

In another embodiment of the invention, when it is determined that the second data in the RAM does not coincide with the second data in the EEPROM, the writing of the second data in the EEPROM is performed again a prescribed plurality of times until it is determined that the second data in the RAM coincides with the second data in the EEPROM. When a determination of coincidence is not obtained even when the writing of the second data in the above-mentioned area of the EEPROM is performed again the prescribed plurality of times, the second data is written in the other area of the EEPROM.

In accordance with the present invention, a check is performed at all times to determine whether new data (the second data) following a change has been written in the EEPROM correctly, and therefore the reliability of the EEPROM is improved. When it is determined that writing has not been performed correctly, the writing of the second data in the same area or another area is performed again. As a result, the reliability with which data is rewritten in the EEPROM is improved. Since data in the first data other than the old data that is to be rewritten is preserved by being written in the RAM, loss of data caused by a data writing failure or by a defect in the EEPROM is prevented.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 4a and 4b are diagrams showing examples of a logical cluster area and examples of a physical cluster area, respectively;

FIGS. 5a, 6a, 7a, 8a and 9a are diagrams showing the manner in which data in the logical cluster area changes; and FIGS. 5b, 6b, 7b, 8b and 9b are diagrams showing the manner in which data in the physical cluster area changes.

DESCRIPTION OF THE PREFERRED EMBODIMENTS

Figure 1:
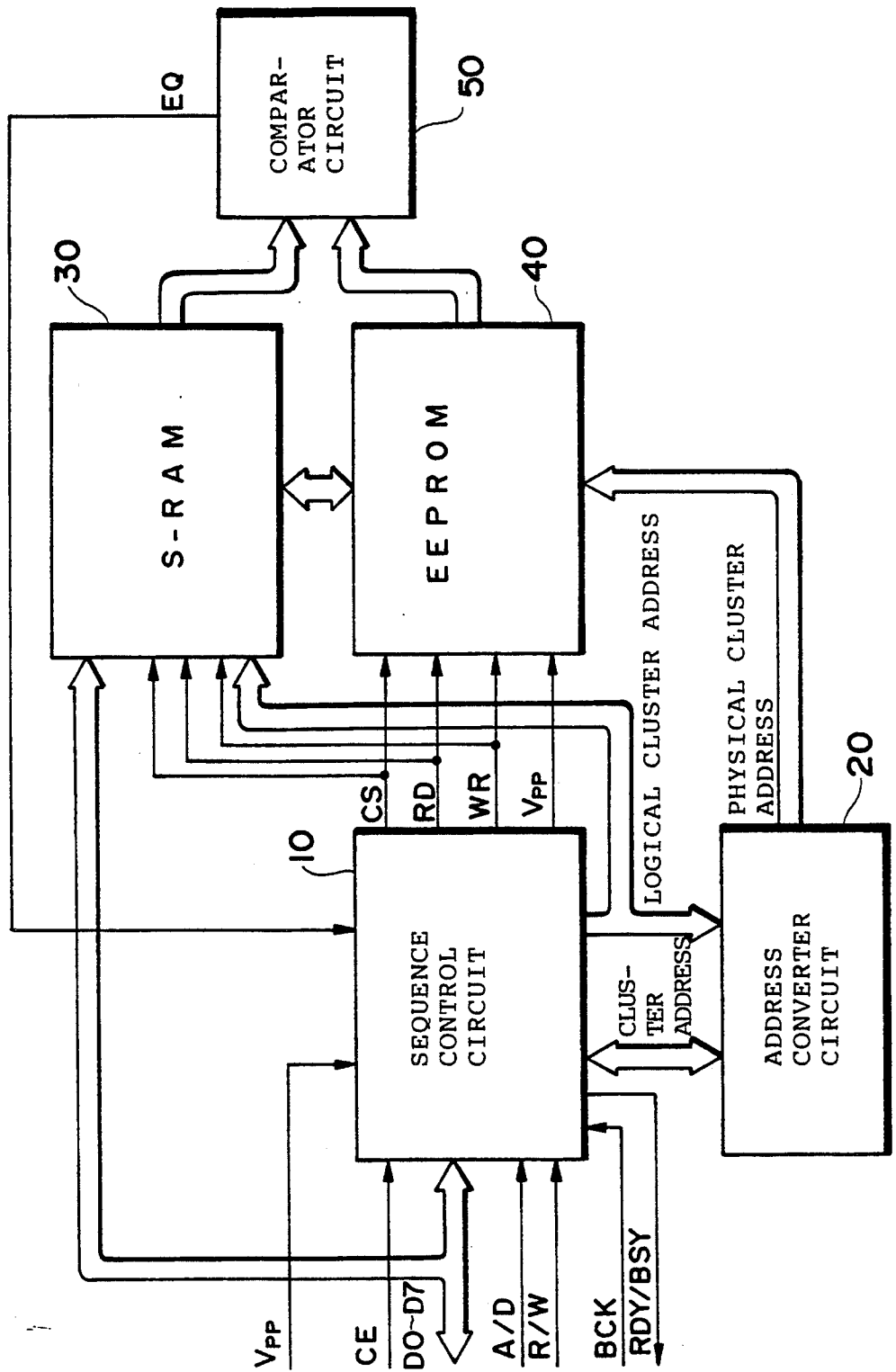
FIG. 1 is a block diagram illustrating the electrical configuration of a memory card.

FIG. 1, which illustrates an embodiment of the present invention, is a block diagram showing the electrical circuit configuration incorporated within the case of a memory card.

A memory card includes a sequence control circuit 10, by which the overall operation of the card is supervised, an address converter circuit 20 for generating addresses, an S-RAM 30, and an EEPROM 40 for storing digital data. The S-RAM 30 is used in order to perform an operation through which data is updated. Data to be written in the EEPROM 40 is stored temporarily in the S-RAM 30.

In order to verify whether data has been written in the EEPROM 40 with certainty, data that has been stored temporarily in the S-RAM 30 is compared with data that has been written in the EEPROM 40. To this end, the memory card contains a comparator circuit 50. If the data that has been stored temporarily in the S-RAM 30 coincides with the data that has been written in the EEPROM 40, the comparator circuit 50 outputs a coincidence signal EQ, after which the data that has been stored in the S-RAM 30 is erased.

Applied to the sequence control circuit 10 from an electronic device (such as an electronic still-video camera), in which the memory card is removably loaded, are a program supply voltage VPP, a card-enable signal CE, image data (data to be written or read) or address data (which designates the location for the writing or reading of the data) D0~D7, a data identifying signal A/D that represents whether the data D0~D7 is image data or address data, a write/read signal R/W that represents the writing of image data to the memory card or the reading of image data from the memory card, and a bus clock pulse BCK. These signals arrive from the electronic device through a connector. The data D0~D7 is applied to the S-RAM 30 as well.

The sequence control circuit 10 outputs a status signal RDY/BSY, which represents whether the memory card is in a state (READY) in which it is capable of sending and receiving image data or address data or in a state (BUSY) in which it is incapable of sending and receiving image data or address data. The electronic device in which the memory card has been loaded is provided with the signal RDY/BSY via the connector.

Figure 2:
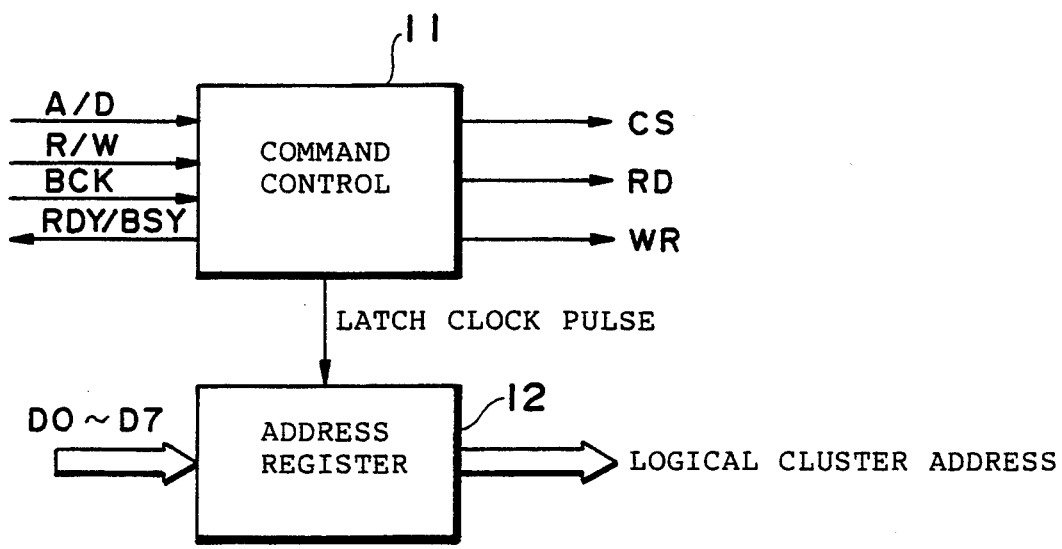
FIG. 2 is block diagram showing the configuration of a sequence control circuit.

FIG. 2 illustrates an example of the construction of the sequence control circuit 10.

As shown in FIG. 2, the sequence control circuit 10 includes a command control circuit 11 and an address register 12.

The above-mentioned data identifying signal A/D, write/read signal R/W and bus clock pulse BCK are fed into the command control circuit 11, which outputs a chip select signal CS, a memory read signal RD and a memory write signal WR. The chip select signal CS, memory read signal RD and memory write signal WR are outputted from the sequence control circuit 10 and applied to the EEPROM 40 and S-RAM 30. The command control circuit 11 outputs the status signal RDY/BSY.

The command control circuit 11 also outputs a latch clock pulse, which is applied to the address register 12. The latter is provided with the data D0~D7. A logical cluster address that designates the address of a logical cluster area contained in the address converter circuit 20 is generated within the address register 12.

The sequence control circuit 10 and address converter circuit 20 send and receive cluster address data to and from each other. The cluster address data includes the address of a logical cluster that designates a cluster in which a data writing error has occurred, the address of a last-written cluster in which writing has been performed last, and the address of a write cluster (over-written cluster address) in which over-writing has been performed.

Figure 3:
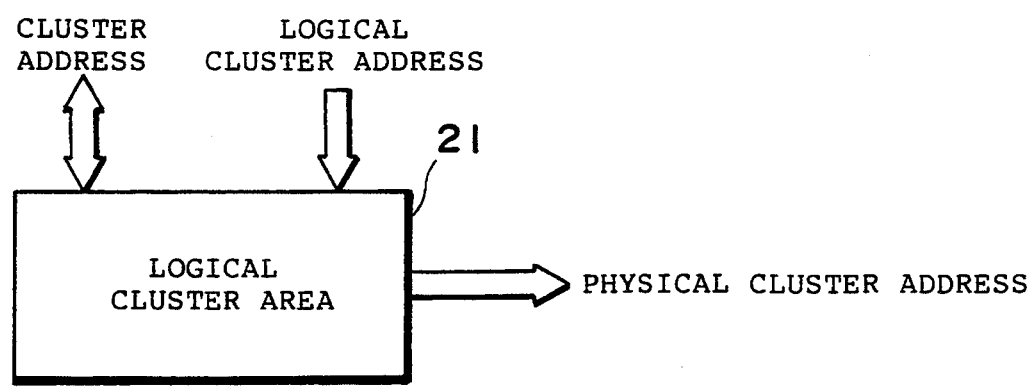
FIG. 3 is a block diagram showing the configuration of an address converter circuit.

FIG. 3 illustrates an example of the construction of the address converter circuit 20.

As shown in FIG. 3, a memory contained in the address converter circuit 20 is provided with a logical cluster area 21. As shown in FIG. 4a, the logical cluster area 21 stores, in correspondence with logical cluster addresses, the physical cluster addresses designated by these logical cluster addresses. When a logical cluster address is applied, the physical cluster address designated by this logical cluster address is read out of the logical cluster area 21 and delivered as an output. This physical cluster address is applied to the EEPROM 40.

When it is determined whether the data that has been stored in the S-RAM 30 coincides with the data that has been written in the EEPROM 40, these items of data are read out of the S-RAM 30 and EEPROM 40 and applied to the comparator circuit 50, as set forth above. The comparator circuit 50 compares these items of data and outputs the coincidence signal EQ when the two items of data coincide. The coincidence signal EQ is applied to the sequence control circuit 10.

FIGS. 4a through 9b schematically represent the cluster areas. FIGS. 4a, 5a, 6a, 7a, 8a and 9a represent the logical cluster area provided in the address converter circuit 20, and FIGS. 4b, 5b, 6b, 7b, 8b and 9b represent the physical cluster area provided in the EEPROM 40.

The term "cluster" refers to a unit of data written to or read from the memory. The rewriting of data is carried out one cluster at a time. In terms of image data, compressed image data that represents one frame of an image is an amount of data equivalent to one cluster or several clusters. The term "physical cluster area" refers to an area in which data is actually stored in the EEPROM 40, and the term "physical cluster address" refers to an address of a location at which data is stored. The term "logical cluster area" refers to an area used in order to manage the physical cluster addresses.

As illustrated in FIG. 4a, the logical cluster area stores the physical cluster addresses in correspondence with logical cluster addresses ad1~ad8 of this area. In FIG. 4a, physical cluster addresses have not yet been written (i.e., the data has been initialized to all "0"s). The address converter circuit 20 is further provided with an area for storing a last-written physical cluster address and an over-written logical cluster address. As shown in FIG. 4b, the physical cluster area stores one cluster of data, for every address, in correspondence with physical cluster addresses AD1~AD12. In FIG. 4b, data has not yet been written and the area is in a "blank state" (all "0"s). Addresses up to ads are shown with regard to the logical cluster area and up to AD12 with regard to the physical cluster area. However, it goes without saying that these areas may be provided with more storage locations as the need arises.

When the READY signal is outputted by the sequence control circuit 10 and the writing of data in the EEPROM 40 is performed, the image data D0~D7 is applied to the memory card. The image data DO~D7 is applied to the S-RAM 30 and, via the S-RAM 30, to the EEPROM 40.

The write/read signal R/W representing the writing operation is applied to the sequence control circuit 10. On the basis of this signal, the sequence control circuit 10 outputs the memory write signal WR, which is applied to the S-RAM 30 and EEPROM 40. As a result, the image data is stored in the S-RAM 30.

Furthermore, the sequence control circuit 10 outputs logical cluster addresses, which are applied to the address converter circuit 20 and the S-RAM 30. As a result of applying the logical cluster addresses to the S-RAM 30, that image data, which has been stored in the S-RAM 30, designated by the logical cluster addresses is applied to the EEPROM 40.

The logical cluster addresses are applied to the address converter circuit 20 and, as shown in FIG. 5a, physical cluster addresses are stored in the logical cluster area. These physical cluster addresses are applied to the EEPROM 40. As a result, the image data provided by the S-RAM 30 is stored in the physical cluster area designated by the physical cluster addresses of the logical cluster area. This state is illustrated in FIG. 5b. Data $A_1$, $B_1$, $C_1$ and $D_1$ is contained in one item of cluster data CLD1 stored at physical cluster address AD1. Similarly, items of cluster data from CLD2 to CLD8 respectively containing data from $A_2$, $B_2$, $C_2$ and $D_2$ to $A_8$, $B_8$, $C_8$ and $D_8$ are stored at the other physical cluster addresses from AD2 to AD8. Though it is described that eight items of cluster data are stored in the EEPROM 40 at one time, it goes without saying that an arrangement may be adopted in which the data is written one cluster at a time or a plurality of clusters at a time. Further, in the same manner as in the case of the rewriting of data described here, image data that has been stored in the S-RAM 30 and the corresponding image data that has been written in the EEPROM 40 are compared one cluster at a time in the comparator circuit 50, and it is determined whether the writing of the data in the EEPROM 40 has been performed correctly.

In the case set forth above, the writing of digital data is performed when all of the storage locations of the physical cluster area are blank, and over-writing is not carried out. Therefore, data "0" is stored as the over-written logical cluster address and data "AD8" is stored as the last-written physical cluster address, as shown in FIG. 5a.

Assume that rewriting of the data that has been stored at the physical cluster address AD2 is performed. In such case, the cluster data CLD2 ($A_2$, $B_2$, $C_2$, and $D_2$) that has been stored at the physical cluster address "AD2" is read out and applied to the S-RAM 30, where the data is stored. Partial rewriting of the data rewriting of old data D2 to new data E2) is performed in the S-RAM 30. More specifically, the data D0~D7 representing the data E2 is applied to the S-RAM 30, and this data is substituted for the old data D2.

The cluster data CLD2 partially rewritten in the S-RAM 30 is applied to the EEPROM 40. The address converter circuit 20 outputs "AD2" as the data of the physical cluster address, and this data is applied to the EEPROM 40. As a result, new cluster data CLD2 ($A_2$, $C_2$, $D_2$, and $E_2$) is stored at the storage location of the physical cluster address "AD2" in the physical cluster area. The new cluster data may thus be stored at the original storage location or at a different storage location in the physical cluster area.

The item of data (the cluster data CLD2 after rewriting) temporarily stored in the S-RAM 30 and the item of data (the new cluster data CLD2) written in the EEPROM 40 are each read out and applied to the comparator circuit 50. The comparator circuit 50 compares these two clusters and outputs the coincidence signal EQ if all bits coincide. This signal is applied to the sequence control circuit 10. As a result, the sequence control circuit 10 verifies that the rewriting of the cluster data CLD2 in the EEPROM 40 has been performed correctly.

If coincidence is not achieved, it is construed that the storage location of the physical cluster address "AD2" is a defective area and this location is no longer used for storage of cluster data. The new cluster data CLD 2 ($A_2$, $C_2$, $D_2$, and $E_2$) that has been rewritten in the S-RAM 30 is written at the storage location of the "blank" physical cluster address "AD9" instead of the storage location of the physical cluster address "AD2". This state is illustrated in FIGS. 6a and 6b. At this time the last-written physical cluster address is incremented and "AD9" is stored.

In the description given above, the cluster data CLD2 that has been rewritten in the S-RAM 30 is written in the EEPROM 40, after which the items of cluster data are read out of the S-RAM 30 and EEPROM 40 and compared. If these items of data do not coincide, a judgment is made that the storage location of address AD2 in the EEPROM 40 is faulty. It is preferred to adopt an arrangement in which the writing of the cluster data at the storage location of address AD2 in the EEPROM 40 and the comparison of the cluster data of the S-RAM 30 with the corresponding cluster data that has been written in the EEPROM 40 be carried out repeatedly a plurality of times until a result indicative of coincidence is obtained, without judging that a storage location is faulty based upon only a single comparison. When a result indicative of coincidence is not obtained even if this processing is repeated a plurality of times, the storage location at address AD2 is judged to be defective.

Operation will now be described for a case in which the cluster data CLD4 at the storage location of address AD4 is shifted to the storage location of address AD3 in the physical cluster area. First, it is necessary to shift the cluster data CLD3 at address AD3 to another location, e.g., the storage location of address AD10.

As shown in FIG. 7a, the address AD10 of the physical cluster area is written to correspond to the logical cluster address ad3 in the logical cluster area. In order to store the fact that the data at this address ad3 has been over-written, "ad3" is written in as the over-write logical cluster address.

The cluster data CLD3 at address AD3 in the physical cluster area is read out and stored temporarily in the S-RAM 30. Thereafter, the cluster data CLD3 is transferred from the S-RAM 30 to the storage location designated by the address AD10 of the EEPROM 40. This is the state illustrated in FIG. 7b. The last-written physical cluster address is updated to AD10.

In this case also, the cluster data CLD3 that has been stored in the S-RAM 30 and the cluster data CLD3 that has been stored at address AD10 of the EEPROM 40 are compared to determine whether the writing of the cluster data in the EEPROM 40 has been performed correctly.

Next, in order to shift the cluster data CLD4 at the physical cluster address AD4 to address AD3, the data at the logical cluster address ad4 is updated to AD3 and the data of over-written logical cluster address AD4 is updated to ad4 (see FIG. 8a). Once the cluster data at the physical cluster address AD4 has been transferred to and stored in the S-RAM 30, this cluster data is written in the storage location at address AD3 of the physical cluster area (see FIG. 8b). The storage location at address AD4 becomes blank. The last-written physical cluster address remains unchanged at "AD10".

In a case where part of the cluster data CLD5 designated by the physical cluster address "AD5" is changed in FIGS. 8a and 8b, the cluster data CLD5 ($A_5$, $B_5$, $C_5$ and $D_5$) at this address is read out and transferred to the S-RAM 30, where a partial change of the data (a change from data $D_5$ to data $E_5$) is performed.

The changed new cluster data CLD5 ($A_5$, $B_5$, $C_5$ and $E_5$) is applied to the EEPROM 40 and written in the blank storage location at address "AD4". The new cluster data CLD5 that has been written in the storage location at address "AD4" is read out of the EEPROM 40 and applied to the comparator circuit 50. The cluster data CLD5 after the change, which data has been stored in the S-RAM 30, is also applied to the comparator circuit 50.

The comparator circuit 50 performs a comparison to determine whether the cluster data CLD5 after the change read out of the S-RAM 30 and the new cluster data CLD5 read out of the EEPROM 40 coincide. If the comparison indicates non-coincidence, it is judged that the writing of the new data in the EEPROM 40 has failed. As a result, the new data is written in the blank storage area at address "AD11". In this case also, the new items of cluster data are read out of the EEPROM 40 and S-RAM 30 and the comparator circuit 50 determines whether these items of data coincide.

The state in which new data has thus been written at the physical cluster address "AD11" is illustrated in FIGS. 9a and 9b. In this case, the over-written logical cluster address is changed to "ad5" and the last-written physical cluster address is changed to "AD11", as illustrated in FIG. 9a.

As many apparently widely different embodiments of the present invention can be made without departing from the spirit and scope thereof, it is to be understood that the invention is not limited to the specific embodiments thereof except as defined in the appended claims.

What is claimed is:

1. A method of rewriting data in an EEPROM comprising the steps of:
    addressing a first area of an EEPROM in which a first unit of data that includes old data to be rewritten has been stored and reading out said first unit of data that has been stored in the first area of said EEPROM;
    writing said first unit of data, which has been read out of the first area of said EEPROM, into a RAM;
    generating a second unit of data in the RAM by rewriting new data for said old data into said first unit of data that has been written in the RAM;
    addressing a second area of said EEPROM in which said second unit of data, which includes said new data, is to be written, and writing said second unit of data, which has been read out of the RAM, into the second area of said EEPROM; and
    reading said second unit of data out of the RAM, reading said second unit of data, which has been written in the second area of said EEPROM, out of the second area of said EEPROM, and determining whether said second unit of data read out of the RAM and said second unit of data read out of the second area of said EEPROM coincide, by comparing the entirety of said respective second units of data in a comparator means.

2. The method according to claim 1, wherein the first area of the EEPROM from which said first unit of data is read out and the second area of the EEPROM in which said second unit of data is written are the same area.

3. The method according to claim 1, further comprising a step of writing said second unit of data into another area of the EEPROM when it is determined that said second unit of data in the RAM does not coincide with said second unit of data in the second area of said EEPROM.

4. The method according to claim 3, further comprising a step of determining again whether said second unit of data in the RAM coincides with said second unit of data that has been written into the other area of said EEPROM.

5. The method according to claim 1, wherein when it is determined that said second unit of data in the RAM does not coincide with said second unit of data in the second area of said EEPROM, the writing of the second unit of data into the second area of said EEPROM is performed again a prescribed plurality of times until it is determined that said second unit of data in the RAM coincides with said second unit of data in the second area of said EEPROM.

6. The method according to claim 5, wherein when a determination of coincidence is not obtained even when the writing of said second unit of data in the second area of said EEPROM is performed again said prescribed plurality of times, said second unit of data is written into another area of the EEPROM.

7. An EEPROM card comprising;
    an EEPROM in which data is capable of being erased and written;
    a RAM for performing an operation through which data in said EEPROM is updated;
    a first unit of data reading/writing means for addressing a first area of said EEPROM in which a first unit of data that includes old data to be rewritten has been stored, reading out the first unit of data that has been stored in the first area of said EEPROM and writing the first unit of data, which has been read out of the first area of said EEPROM, into said RAM;
    a data updating means for generating a second unit of data by rewriting new data-for the old data in the first unit of data that has been rewritten into said RAM;
    a data writing means for addressing a second area of said EEPROM in which the second unit of data, which has been generated by said data updating means, is to be written, and writing the second unit of data into the second area of said EEPROM; and
    a discriminating means for comparing the second unit of data in said RAM, which contains said new data that has been rewritten for the old data by said data updating means, with the second unit of data that has been written in the second area of said EEPROM by said data writing means, and determining whether the rewritten second unit of data in the RAM and the second unit of data written in the second area of said EEPROM coincide, by comparing the entirety of said respective second units of data in a comparator means.

8. The EEPROM card according to claim 7, further comprising a control means for controlling said data writing means in such a manner that said second unit of data is written into another area of said EEPROM when it is determined that the second unit of data in said Ram does not coincide with the second unit of data in the second area of said EEPROM.

9. The EEPROM card according to claim 7, further comprising a control means for controlling said data writing means in such a manner that when it is determined that the second unit of data in said RAM generated by said data updating means does not coincide with the second unit of data written into the second area of said EEPROM by said data writing means, the writing of the second unit of data into the second area of said EEPROM is performed again a prescribed plurality of times until it is determined that the second unit of data, generated by said data updating means, in the RAM coincides with the second unit of data in the second area of said EEPROM.

10. The method according to claim 1, wherein the first area of the EEPROM from which said first unit of data is read out and the second area of the EEPROM in which said second unit of data is written are different areas.

11. The EEPROM card according to claim 7, wherein the first area of the EEPROM from which said first unit of data is read out and the second area of the EEPROM in which said second unit of data is written are different areas.

12. The EEPROM card according to claim 7, wherein the first area of the EEPROM from which said first unit of data is read out and the second area of the EEPROM in which said second unit of data is written are the same area.

13. The method of claim 2 further comprising the steps of providing a logical unit address and associating said logical unit address with said first area of the EEPROM and said second area of said EEPROM.

14. The EEPROM card of claim 7 further comprising a logical unit address, said logical unit address being associated with said first area of the EEPROM and said second area of said EEPROM.

15. The method of claim 10 further comprising the steps of providing a logical unit area having a plurality of logical unit addresses, associating one of said logical addresses with said first area of the EEPROM, and associating a second of said logical addresses with said second area of the EEPROM.

16. The method of claim 15 whereby said logical unit area further comprises a last-written physical unit address and the method further comprising the step of associating said last-written physical unit address with said second area of said EEPROM.

17. The method of claim 16 whereby said logical unit area further comprises an over-written logical unit address upon which a record is made of said logical addresses associated with the first area of the EEPROM.

18. The EEPROM card of claim 12 further comprising management means having a logical unit area, said logical unit area having a plurality of logical unit addresses, and whereby at least one of said plurality of logical unit addresses is associated with said first area of the EEPROM, and at least one of said logical unit addresses is associated with said second area of the EEPROM, said logical unit address associated with the second area being different from said logical unit address associated with the first area of the EEPROM.

19. The EEPROM card of claim 18 whereby said management means further comprises a last-written physical unit address and whereby said last-written physical unit address is associated with said second area of said EEPROM.

20. The EEPROM card of claim 19 whereby said management means further comprises an over-written logical unit address upon which a record is made of the logical address associated with said first area of the EEPROM.

* * * * *